United States Patent
Hosokawa

(10) Patent No.: US 9,716,212 B2
(45) Date of Patent: Jul. 25, 2017

(54) LIGHT EMITTING DEVICE

(71) Applicant: NICHIA CORPORATION, Anan-shi, Tokushima (JP)

(72) Inventor: Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/969,602

(22) Filed: Dec. 15, 2015

(65) Prior Publication Data

US 2016/0181473 A1    Jun. 23, 2016

(30) Foreign Application Priority Data

Dec. 19, 2014 (JP) .................... 2014-258083
Aug. 18, 2015 (JP) .................... 2015-160990

(51) Int. Cl.
  *H01L 33/32*   (2010.01)
  *H01L 33/50*   (2010.01)

(52) U.S. Cl.
  CPC .................. *H01L 33/504* (2013.01)

(58) Field of Classification Search
  CPC ....................................... H01L 33/32
  USPC ........................................... 257/42
  See application file for complete search history.

(56) References Cited

U.S. PATENT DOCUMENTS

| | | | | |
|---|---|---|---|---|
| 2006/0071589 A1* | 4/2006 | Radkov | ............. | C09K 11/0883 313/487 |
| 2008/0308818 A1* | 12/2008 | Wang | ................. | C09K 11/7734 257/88 |
| 2010/0213491 A1* | 8/2010 | Lu | ........................ | H01L 33/504 257/98 |
| 2011/0215709 A1 | 9/2011 | Hiramatsu | | |

FOREIGN PATENT DOCUMENTS

| | | |
|---|---|---|
| JP | 2003-121838 A | 4/2003 |
| JP | 2007-027796 A | 2/2007 |
| JP | 3928684 B2 | 6/2007 |
| JP | 2008-303331 A | 12/2008 |
| JP | 4989936 B2 | 8/2012 |
| JP | 5066204 B2 | 11/2012 |
| JP | 5345451 B2 | 11/2013 |

* cited by examiner

*Primary Examiner* — Kenneth Parker
*Assistant Examiner* — Warren H Kilpatrick
(74) *Attorney, Agent, or Firm* — Andrews Kurth Kenyon LLP

(57) ABSTRACT

A light emitting device including a light emitting element that has a peak light emission wavelength of from 400 nm to 455 nm, a first fluorescent material that has a peak fluorescence wavelength in the range of from 650 nm to 670 nm, and a second fluorescent material that has a peak fluorescence wavelength in the range of from 520 nm to 550 nm, wherein the light emitting device exhibits a light emission spectrum with an average light emission strength of 30% or less in the range of from 600 nm to 620 nm, when the maximum light emission strength in the range of from 520 nm to 550 nm is taken as 100%.

17 Claims, 9 Drawing Sheets

LIGHT EMITTING DEVICE

CROSS-REFERENCE TO RELATED APPLICATION

This application claims priority to Japanese Patent Application No. 2014-258083, filed on Dec. 19, 2014 and Japanese Patent Application No. 2015-160990, filed on Aug. 18, 2015. The entire disclosures of Japanese Patent Application No. 2014-258083 and No. 2015-160990 are hereby incorporated herein by reference.

BACKGROUND OF THE INVENTION

Field of the Invention
The present disclosure relates to a light emitting device.
Description of the Related Art
A light emitting device capable of emitting white light has been developed by combining an LED (Light Emitting Diode) as a light emitting element that emits blue light with a fluorescent material that is excited by the blue light and emits green light and a fluorescent material that emits red light. For example, JP 2008-303331A describes a nitride or an oxynitride having a β-type $Si_3N_4$ crystalline structure (a β sialon fluorescent material), which is a fluorescent material that emits green light. JP 2008-303331A also describes a light emitting device that includes the green fluorescent material, a red fluorescent material ($CaSiAlN_3$:Eu), and a blue LED, and that emits white light. The white light is obtained by exciting the green and red fluorescent materials with the blue LED, thereby mixing light from the LED and the fluorescent materials.

Furthermore, JP 2007-027796A describes a light emitting device including a light emitting element that emits blue light, a fluorescent material that is excited by the blue light and emits green light (($Sr,Ba)_2SiO_4$:Eu), and a fluorescent material that emits red light ($CaAlSiN_3$:Eu). The peak wavelength of the $(Sr,Ba)_2SiO_4$:Eu fluorescent material may be adjusted within the range of from 520 nm to 600 nm. This permits control of the range of color reproduction, resulting in a wide range of color reproduction.

As a related art focusing on the color reproducibility (NTSC (National Television System Committee) ratio) of a liquid crystal display (LCD), for example, JP2003-121838A describes a liquid crystal display that includes a backlight light source having a spectral peak in the range of from 505 nm to 535 nm. The backlight light source includes a green fluorescent material such as $MgGa_2O_4$:Mn and $Zn_2SiO_4$:Mn, containing any one of europium, tungsten, tin, antimony, and manganese, as an activator.

SUMMARY OF THE INVENTION

A light emitting device includes a light emitting element having a peak light emission wavelength of from 400 nm to 455 nm, a first fluorescent material that is represented by formula (I) and has a peak fluorescence wavelength in the range of from 650 nm to 670 nm, and a second fluorescent material that has a peak fluorescence wavelength in the range of from 520 nm to 550 nm. The light emitting device exhibits a light emission spectrum with an average light emission strength of 6% or less in the range of from 600 nm to 620 nm when the maximum light emission strength in the range of from 400 nm to 455 nm is taken as 100%.

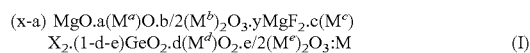

(I)

In the formula, $M^a$ is at least one element selected from the group consisting of Ca, Sr, Ba, and Zn; $M^b$ is at least one element selected from the group consisting of Sc, La, and Lu; $M^c$ is at least one element selected from the group consisting of Ca, Sr, Ba, and Zn; X is at least one element selected from the group consisting of F and Cl; $M^d$ is at least one element selected from the group consisting of Ti, Sn, and Zr; and $M^e$ is at least one element selected from the group consisting of B, Al, Ga, and In. In addition, x, y, a, b, c, d, and e satisfy $2 \leq x \leq 4$, $0 < y \leq 2$, $0 \leq a \leq 1.5$, $0 \leq b < 1$, $0 \leq c \leq 2$, $0 \leq d \leq 0.5$, $0 \leq e < 1$, and $0 < d+e < 1$, respectively.

The light emitting device can achieves a wide range of color reproduction and has superior luminous efficiency when the device is included in an image display apparatus.

DETAILED DESCRIPTION OF THE INVENTION

Figure 1:
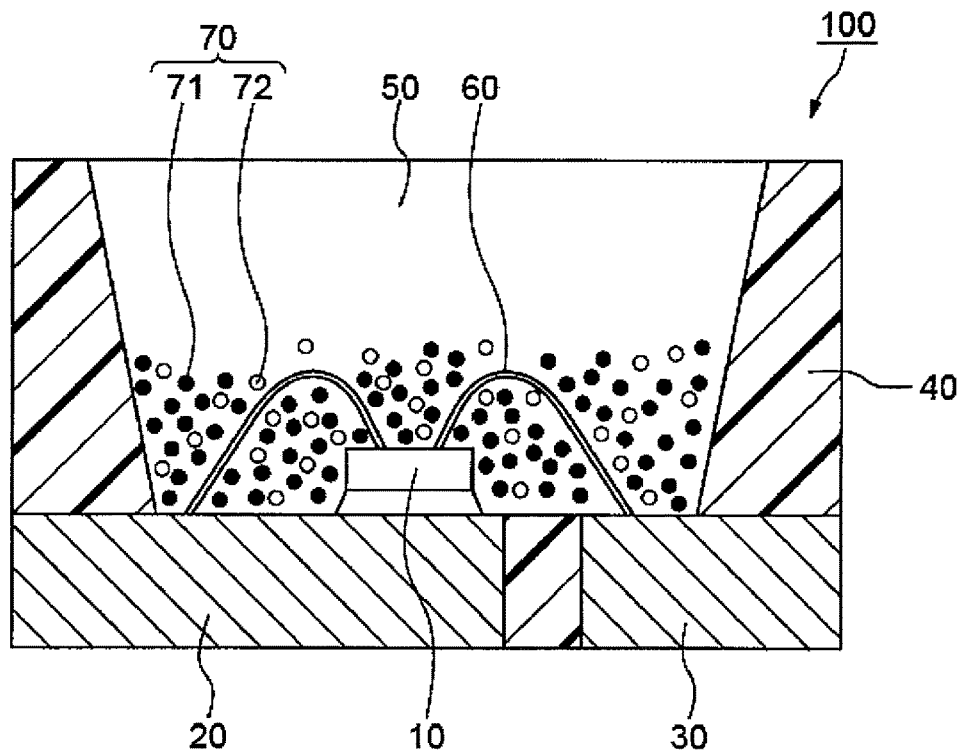
FIG. 1 is a schematic cross-sectional view showing an example of a light emitting device according to the present embodiment.

The light emitting device of Patent Document 1 incorporates a β sialon fluorescent material, which is a green fluorescent material, and $CaAlSiN_3$:Eu fluorescent material or $(Ca,Sr,Ba)_2Si_5N_8$:Eu fluorescent material, which is a red fluorescent material. These fluorescent materials, however, have a greater half bandwidth, resulting in a large portion of intermediate components between green and red. This makes it difficult to accurately cover the color reproducing range at an NTSC ratio, often failing to achieve a higher precision image display.

In the light emitting device of Patent Document 2, there is a concern that it may be difficult to precisely cover the color reproducing range because the green fluorescent material has a broad half bandwidth.

Furthermore, when the green fluorescent material incorporated in the backlight light source of Patent Document 3 is used together with a light emitting element having a peak wavelength of from 430 nm to 480 nm, the excitation wavelength of the fluorescent material fails to coincide with the peak wavelength of the light emitting element, resulting in substantially low luminous efficiency.

To solve these problems, an embodiment of the present disclosure provides a light emitting device that achieves a wide range of color reproduction and has superior luminous efficiency when the device is included in an image display apparatus.

The present disclosure includes the following modes.

A first mode of the present disclosure is a light emitting device including:

a light emitting element having a peak light emission wavelength of from 400 nm to 455 nm, a first fluorescent material that is represented by formula (I) and has a peak fluorescence wavelength in the range of from 650 nm to 670 nm, and a second fluorescent material that has a peak fluorescence wavelength in the range of from 520 nm to 550 nm, wherein, when the maximum light emission strength in the range of from 400 nm to 455 nm is taken as 100%, the light emitting device exhibits a light emission spectrum with an average light emission strength of 6% or less in the range of from 600 nm to 620 nm.

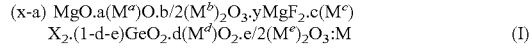

$$(x-a)\,MgO \cdot a(M^a)O \cdot b/2(M^b)_2O_3 \cdot yMgF_2 \cdot c(M^c)$$
$$X_2 \cdot (1-d-e)GeO_2 \cdot d(M^d)O_2 \cdot e/2(M^e)_2O_3{:}M \qquad (I)$$

In the formula, $M^a$ is at least one element selected from the group consisting of Ca, Sr, Ba, and Zn; $M^b$ is at least one element selected from the group consisting of Sc, La, and Lu; $M^c$ is at least one element selected from the group consisting of Ca, Sr, Ba, and Zn; X is at least one element selected from the group consisting of F and Cl; $M^d$ is at least one element selected from the group consisting of Ti, Sn, and Zr; and $M^e$ is at least one element selected from the group consisting of B, Al, Ga, and In. In addition, x, y, a, b, c, d, and e satisfy $2 \le x \le 4$, $0 < y \le 2$, $0 \le a \le 1.5$, $0 \le b < 1$, $0 \le c \le 2$, $0 \le d \le 0.5$, $0 \le e < 1$, and $0 < d+e < 1$, respectively.

A second mode of the present disclosure is a light emitting device including:

a light emitting element having a peak light emission wavelength of from 400 nm to 455 nm, a first fluorescent material that is represented by formula (I) and has a peak fluorescence wavelength in the range of 650 nm to 670 nm, and a second fluorescent material that has a peak fluorescence wavelength in the range of from 520 nm to 550 nm, wherein, when the maximum light emission strength in the range of from 520 nm to 550 nm is taken as 100%, the light emitting device exhibits a light emission spectrum with an average light emission strength of 30% or less in the range of from 600 nm to 620 nm.

The embodiment according to the present disclosure provides a light emitting device that reproduces a wide range of color and has superior luminous efficiency when incorporated in an image display apparatus.

Hereinafter, the light emission device according to the present disclosure will be described with reference to the embodiments and Examples. The embodiments shown below are, however, mere examples of the light emitting device for embodying the technical concept of the present invention, and the present invention is not to be limited to the particulars of the light emitting devices described below.

The relationships between the color names and the chromaticity coordinates, the relationships between the wavelength ranges of light and the color names of monochromatic light, and others are in accordance with JIS Z8110.

In the present specification, for the amount of each component contained in the composition, when a plurality of compounds corresponding to the component exists, the amount of the component indicates the total amount of the compounds present in the composition unless otherwise specified.

[Light Emitting Device]

The light emitting device of the present embodiment is a light emitting device including a light emitting element having a peak light emission wavelength of from 400 nm to 455 nm, a first fluorescent material represented by formula (I) and has a peak fluorescence wavelength in the range of from 650 nm to 670 nm, and a second fluorescent material that has a peak fluorescence wavelength in the range of from 520 nm to 550 nm. The light emitting device exhibits a light emission spectrum with an average light emission strength of 6% or less in the range of from 600 nm to 620 nm when the maximum light emission strength in the range of from 400 nm to 455 nm is taken as 100%.

The light emitting device of the present embodiment exhibits a light emission spectrum having an average light emission strength of 30% or less in the range of from 600 nm to 620 nm when the maximum light emission strength in the range of from 520 nm to 550 nm is taken as 100%.

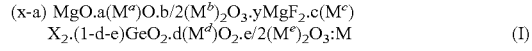

$$(x-a)\,MgO \cdot a(M^a)O \cdot b/2(M^b)_2O_3 \cdot yMgF_2 \cdot c(M^c)$$
$$X_2 \cdot (1-d-e)GeO_2 \cdot d(M^d)O_2 \cdot e/2(M^e)_2O_3{:}M \qquad (I)$$

In the formula, $M^a$ is at least one element selected from the group consisting of Ca, Sr, Ba, and Zn; $M^b$ is at least one element selected from the group consisting of Sc, La, and Lu; $M^c$ is at least one element selected from the group consisting of Ca, Sr, Ba, and Zn; X is at least one element selected from the group consisting of F and Cl; $M^d$ is at least one element selected from the group consisting of Ti, Sn, and Zr; and $M^e$ is at least one element selected from the group consisting of B, Al, Ga, and In. In addition, x, y, a, b, c, d, and e satisfy $2 \le x \le 4$, $0 < y \le 2$, $0 \le a \le 1.5$, $0 \le b < 1$, $0 \le c \le 2$, $0 \le d \le 0.5$, $0 \le e < 1$, and $0 < d+e < 1$, respectively.

By using a light emitting element having a specific peak light emission wavelength as an excitation light source and combining it with a red fluorescent material of specified compositions and a green fluorescent material, the amount of components in the yellow-red region in the light emission spectrum is reduced to no more than a certain amount. Such a light emitting device may be superior to conventional light emitting devices in color separation of the spectrum of the mixed light emitted by the device when the light emitting device is used for an image display apparatus. This enables expansion of the color reproducing range of the image display apparatus, and achieves further superior luminous efficiency.

By applying the light emitting device of the present embodiment to an image display apparatus, the color reproducing range of the image display apparatus can be expanded. The color reproducing range is evaluated, for example, by using an NTSC ratio as an indicator. NTSC ratio is the ratio of the color gamut of an image display apparatus to the area of the NTSC (National Television System Committee) triangle, defined by red (0.670, 0.330), green (0.210, 0.710), and blue (0.140, 0.080) as expressed in chromaticity coordinates (x, y) on a chromaticity diagram of the XYZ colorimetric system (red, green, and blue). The color reproducing range becomes broader than that of conventional light emitting devices by using the light emitting device of the present embodiment.

The light emission spectrum of the light emitting device has an average light emission strength of 6% or less in the range of from 600 nm to 620 nm, when the maximum light emission strength in the range of from 400 nm to 455 nm is taken as 100%, and it is preferably 5% or less to expand the color reproducing range.

Furthermore, the light emission spectrum of the light emitting device has an average light emission strength of 30% or less in the range of from 600 nm to 620 nm, when the maximum light emission strength in the range of from 520 nm to 550 nm is taken as 100%, and it is preferably 25% or less, and more preferably 20% or less to expand the color reproducing range.

The average light emission strength in the range of from 600 nm to 620 nm is adjustable by appropriately selecting, for example, the constitutions of the first fluorescent material and the second fluorescent material.

The average light emission strength over a specific wavelength range is a calculated average value of the light emission strength in the specific wavelength range of the light emission spectrum. Specifically, the light emission strength is measured for every 1 nm in the wavelength range of the light emission spectrum, and the average light emission strength is obtained by dividing the total of the measured values of the light emission strength by the number of measurements.

The form of the light emitting device is not particularly limited, and it may be suitably selected from conventional forms. Examples of the forms of the light emitting device include through-hole mounting and surface mounting types. In through-hole mounting, generally, a light-emitting device is fixed to a mount board by placing leads of the light-emitting device into through-holes formed in the mount board. In contrast, with surface mounting, the leads of the light-emitting device are fixed to the surface of the mount board.

An example of a light emitting device 100 according to the present embodiment will be explained with reference to the drawings. FIG. 1 is a schematic cross-sectional view of an example of a light emitting device 100 according to the present embodiment. The light emitting device 100 is an example of a surface mounting type-light emitting device.

The light emitting device 100 emits visible light at short-wavelengths (e.g., from 380 nm to 485 nm) and includes a light emitting element 10 made of a gallium nitride compound-semiconductor having a peak light emission wavelength of from 400 nm to 455 nm and a molded body 40 on which the light emitting element 10 is disposed. The molded body 40 includes a first lead 20, a second lead 30, and a thermoplastic resin or a thermosetting resin, which are formed in an integral manner. The molded body 40 has a recess defined by a bottom surface and side surfaces, and the light emitting element 10 is disposed on the bottom surface of the recess. The light emitting element 10 has a pair of electrodes, positive and negative, and the positive and negative electrodes are electrically connected to the first lead 20 and the second lead 30, respectively, with a wire 60. The light emitting element 10 is covered with a fluorescence member 50. The fluorescence member 50 preferably contains a thermosetting resin, such as epoxy resin, silicone resin, epoxy-modified silicone resin, and modified silicone resin. The fluorescence member 50 is composed of a red fluorescent material (a first fluorescent material 71) and a green fluorescent material (a second fluorescent material 72), as a fluorescent material 70 that converts the wavelength of light emitted from the light emitting element 10, and a resin.

The fluorescence member 50 is formed by filling, for example, a translucent resin or glass into the recess of the light emitting device 100 in such a manner to cover the light emitting element 10 disposed in the recess. To facilitate production, the material that constitutes the fluorescence member is preferably a translucent resin. Although a silicone resin composition may be preferably used as a translucent resin, an insulating resin composition, such as an epoxy resin composition and an acrylic resin composition, may also be used. Although the fluorescence member 50 contains a first fluorescent material 71 and a second fluorescent material 72, it may contain additional materials as necessary. For example, a light diffusing agent may ease the directivity of light emitted from the light emitting element, widening the angle of visibility.

The fluorescence member 50 serves not only as a member containing the fluorescent material 70 for converting the wavelength, but also as a member for protecting the light emitting element 10, the first fluorescent material 71, and the second fluorescent material 72 from the outside environment. In FIG. 1, the particles of the first fluorescent material 71 and the second fluorescent material 72 are unevenly dispersed in the fluorescence member 50. Arranging the particles of the first fluorescent material 71 and the second fluorescent material 72 closer to the light emitting element 10 in this manner allows efficient conversion of the wavelength of light from the light emitting element 10, thereby providing a light emitting device with superior light emitting efficiency. It should be noted that the arrangement of the particles of the first fluorescent material 71 and the second fluorescent material 72 contained in the fluorescent member 50, and the light emitting element 10 is not limited to one in which they are in close proximity to each other, and the particles of the first fluorescent material 71 and the second fluorescent material 72 may be arranged spaced apart from the light emitting element 10 within the fluorescence member 50 to avoid the influence of heat on the first fluorescent material 71 and the second fluorescent material 72. The particles of the first fluorescent material 71 and the second fluorescent material 72 may also be approximately evenly dispersed in the entire fluorescence member 50 so as to obtain light with reduced color unevenness.

FIG. 1 shows the fluorescent material 70 containing a mixture of the particles of the first fluorescent material 71 and the particles of the second fluorescent material 72. The particles of the first fluorescent material 71 and the particles of the second fluorescent material 72 may be arranged substantially separately as shown in FIG. 2.

Figure 2:
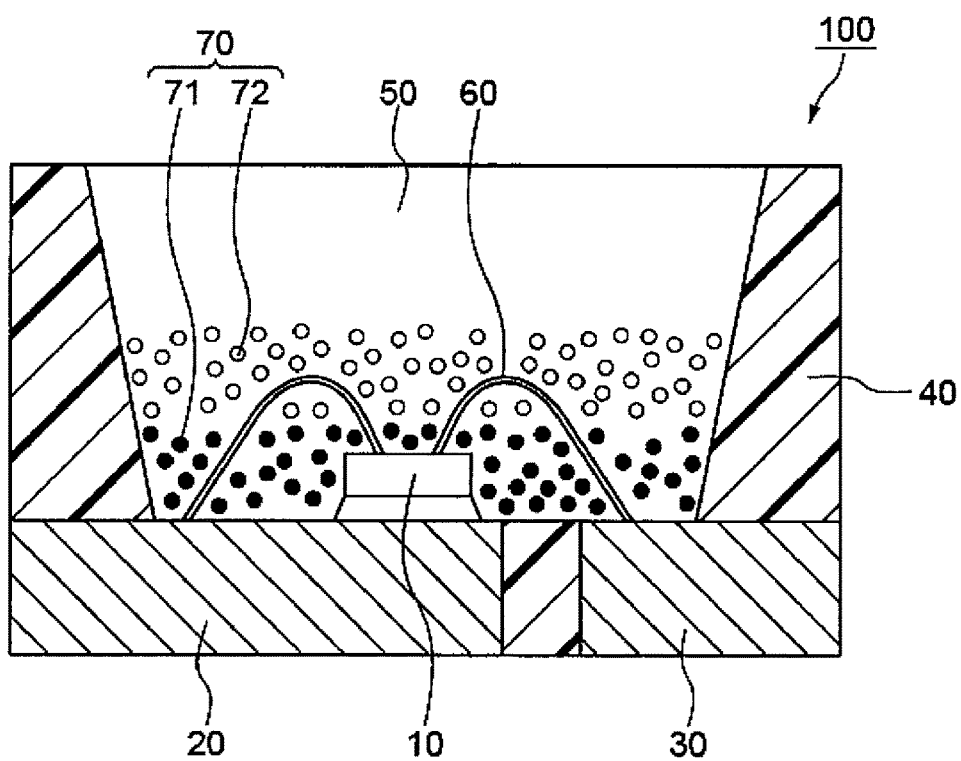
FIG. 2 is a schematic cross-sectional view showing another example according to the present embodiment.

FIG. 2 is a schematic cross-sectional view showing another example of a light emitting device according to the present embodiment. In FIG. 2, the first fluorescent material 71 and the second fluorescent material 72 are arranged such that the first fluorescent material 71 is closer to the light emitting element 10 than the second fluorescent material 72. Arranging the second fluorescent material 72 on the first fluorescent material 71 in this manner reduces loss of emitted light attributable to the reflection from the first fluorescent material 71, and facilitates the extraction of light emitted from the second fluorescent material 72 to the outside of the light emitting device. In addition, although the amount of the fluorescent material of the first fluorescent material 71 tends to be greater because the first fluorescent material 71 absorbs less blue light, arranging the first fluorescent material 71 under the second fluorescent material 72 facilitates extraction of the light emitted from the second fluorescent material 72. For these reasons, the luminous efficiency of the light emitting device is believed to be further enhanced.

(Light Emitting Element)

The peak light emission wavelength of the light emitting element lies in the range of from 400 nm to 455 nm. Using a light emitting element having a peak light emission wavelength in this range as an excitation light source yields a light emitting device that emits light resulting from a mix of the light from the light emitting element and fluorescence from the fluorescent materials. In addition, because this allows effective use of the light radiated from the light emitting element to the outside, the loss of light emitted from the light emitting device can be minimized, resulting in a highly efficient light emitting device.

The half bandwidth of the light emission spectrum of the light emitting element is not particularly limited. The half bandwidth may be, for example, 30 nm or less.

The light emitting element preferably uses a semiconductor light emitting element. Using a semiconductor light emitting element as the excitation light source provides a highly efficient light emitting device that has high output linearity to the input and is resistant and stable to mechanical impact.

For example, a semiconductor light emitting element that includes a nitride semiconductor $(In_XAl_YGa_{1-X-Y}N, 0 \leq X, 0 \leq Y, X+Y \leq 1)$, which emits blue or green light, may be used as the semiconductor light emitting element.

The light emitting device may have a plurality of light emitting elements. When a plurality of light emitting elements is used, the light emitting elements may have the same or different peak wavelengths from one another. The light emitting device having a plurality of light emitting elements may have at least a first light emitting element with a peak light emission wavelength of from 400 nm to 430 nm and a second light emitting element with a peak light emission wavelength of greater than 430 nm and no more than 455 nm.

(Fluorescent Material)

First Fluorescent Material

The light emitting device has at least one of the first fluorescent materials that has a peak fluorescence wavelength in the range of from 650 nm to 670 nm and that is represented by formula (I).

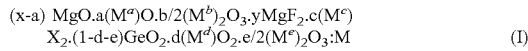

$(x-a) MgO \cdot a(M^a)O \cdot b/2(M^b)_2O_3 \cdot yMgF_2 \cdot c(M^c)$
$X_2 \cdot (1-d-e)GeO_2 \cdot d(M^d)O_2 \cdot e/2(M^e)_2O_3:M$  (I)

In the formula, $M^a$ is at least one element selected from the group consisting of Ca, Sr, Ba, and Zn; $M^b$ is at least one element selected from the group consisting of Sc, La, and Lu; $M^c$ is at least one element selected from the group consisting of Ca, Sr, Ba, and Zn; X is at least one element selected from the group consisting of F and Cl; $M^d$ is at least one element selected from the group consisting of Ti, Sn, and Zr; and $M^e$ is at least one element selected from the group consisting of B, Al, Ga, and In. In addition, x, y, a, b, c, d, and e satisfy $2 \leq x \leq 4$, $0 < y \leq 2$, $0 \leq a \leq 1.5$, $0 \leq b < 1$, $0 \leq c \leq 2$, $0 \leq d \leq 0.5$, $0 \leq e < 1$, and $0 < d+e < 1$, respectively.

The first fluorescent material emits red light. The half bandwidth of the light emission spectrum of the first fluorescent material is not particularly limited, and, for example, it is preferably 45 nm or less, and more preferably 40 nm or less. The light emission spectrum of the first fluorescent material preferably has an average light emission strength of 20% or less, more preferably 10% or less in the range of from 600 nm to 620 nm when the maximum light emission strength is taken as 100%.

The light emitting device may incorporate one type of the first fluorescent materials alone or two or more types in combination.

The first fluorescent material preferably has a composition that is adjusted such that it has higher luminous efficiency compared to a red fluorescent material that is represented by the formula $3.5MgO \cdot 0.5MgF_2 \cdot GeO_2:Mn$ and whose composition is not adjusted.

The average particle size of the first fluorescent material contained in the light emitting device is not particularly limited, and may be suitably selected according to the purpose, for example. The average particle size of the first fluorescent material is preferably from 2 μm to 35 μm, and more preferably from 5 μm to 30 μm in view of luminous efficiency.

The average particle size of the first fluorescent material is a numerical value called Fisher Sub Sieve Sizer's No., and measured by using the air permeability method.

The amount of the first fluorescent material incorporated in the light emitting device may be appropriately selected according to the purpose, for example. The amount of the first fluorescent material may be, for example, from 10 parts by weight to 100 parts by weight and is preferably from 20 parts by weight to 80 parts by weight relative to 100 parts by weight of the resin contained in the fluorescence member.

The first fluorescent material preferably satisfies one or more of the following (1) to (12).

(1) $2.5 < x < 3.6$
(2) $0 < y < 1$
(3) $a=0$
(4) $0 \leq b < 0.5$, or $0 \leq b < 0.2$
(5) $0 \leq c \leq 1.5$, or $0 \leq c \leq 0.5$
(6) $0 \leq d \leq 0.25$, or $0 \leq d \leq 0.1$
(7) $0 \leq e \leq 0.5$, or $0 \leq e \leq 0.3$
(8) $0 < d+e < 0.2$
(9) $M^b$ contains Sc.
(10) $M^c$ contains Ca, and X is F or Cl.
(11) $M^d$ contains Ti.
(12) $M^e$ contains Ga.

Second Fluorescent Material

The light emitting device contains at least one type of the second fluorescent material that has a peak fluorescence wavelength in the range of from 520 nm to 550 nm.

The second fluorescent material preferably has a half bandwidth of the light emission spectrum of 70 nm or less, and more preferably 65 nm or less. The average light emission strength of the second fluorescent material in the range of from 600 nm to 620 nm, when the maximum light emission strength in the light emission spectrum is taken as 100%, is preferably 20% or less, and more preferably 17% or less.

The second fluorescent material is preferably at least one type selected from the group consisting of β sialon fluorescent materials represented by formula (IIa); silicate fluorescent materials represented by formula (IIb); halo silicate fluorescent materials represented by formula (IIc); and sulfide fluorescent materials represented by formula (IId).

$Si_{6-z}Al_zO_zN_{8-z}:Eu$  (IIa)

wherein, z satisfies $0 < z \leq 4.2$.

$(Ba,Sr,Ca,Mg)_2SiO_4:Eu$  (IIb)

$(Ca,Sr,Ba)_8MgSi_4O_{16}(F,Cl,Br)_2:Eu$  (IIc)

$(Ba,Sr,Ca)Ga_2S_4:Eu$  (IId)

In formula (IIa), z preferably satisfies $0.01 < z < 2$.

The light emitting device may incorporate one type of the second fluorescent materials alone or two or more types in combination.

The average particle size of the second fluorescent material contained in the light emitting device is not particularly limited, and may be appropriately selected according to the purpose, for example. The average particle size of the second fluorescent material is preferably from 2 µm to 35 µm, and more preferably 5 µm to 30 µm in view of luminous efficiency.

The average particle size of the second fluorescent material is a numerical value called Fisher Sub Sieve Sizer's No. and is measured by using the air permeability method.

The amount of the second fluorescent material incorporated in the light emitting device may be appropriately selected according to the purpose, for example. The amount of the second fluorescent material may be, for example, from 1 part by weight to 50 parts by weight relative to 100 parts by weight of the resin contained in the fluorescence member, and is preferably from 2 parts by weight to 40 parts by weight.

The ratio of the first fluorescent material to the second fluorescent material in the light emitting device is not particularly limited as long as the desired light emitting properties are achieved, and may be appropriately selected according to the purpose, for example. The ratio of the first fluorescent material to the second fluorescent material (the first fluorescent material/the second fluorescent material) may be, for example, from 0.2 to 50, and is preferably from 0.5 to 40 in weight.

Other Fluorescent Materials

The light emitting device may further incorporate other fluorescent materials in addition to the first fluorescent material and the second fluorescent material. Examples of the other fluorescent materials may include $(Y,Gd,Tb,Lu)_3(Al,Ga)_5O_{12}$:Ce, $Ca_3Sc_2Si_3O_{12}$:Ce, $CaSc_2O_4$:Ce, $(La,Y)_3Si_6N_{11}$:Ce, $(Ca,Sr,Ba)_3Si_6O_9N_4$:Eu, $(Ca,Sr,Ba)_3Si_6O_{12}N_2$:Eu, $(Sr,Ca)AlSiN_3$:Eu, $(Ca,Sr,Ba)_2Si_5N_8$:Eu, $(Ca,Sr,Ba)S$:Eu, and $(Ca,Sr)LiAl_3N_4$:Eu. When the light emitting device incorporates other fluorescent materials, the amount contained may be appropriately selected according to the purpose, for example. The amount is, for example, 10 wt % or less, or 1 wt % or less relative to the total amount of the first fluorescent material and the second fluorescent material.

The method for manufacturing the fluorescent materials is not particularly limited, and may be appropriately selected from known means. For example, the fluorescent materials may be produced as described below. The materials, such as elements in a single body, an oxide, carbonate, nitride, chloride, fluoride, and sulfide, that are contained in the composition of the fluorescent material are weighed so that the materials are contained in a predetermined compositional ratio to each other. Furthermore, additives, such as a flux, may be appropriately added to the materials, and the materials are dry-mixed or wet-mixed using a mixer. This accelerates a solid-phase reaction, which enables formation of particles of a uniform size. As a mixer, a pulverizer, may be used. Examples of suitable pulverizers include a vibrational mill, a roll mill, and a jet mill, in addition to a ball mill, which is commonly used in the industry. The specific surface area may also be increased by grinding the mixture using a pulverizer. To prepare a powder having a specific surface area within a certain range, the particles may be classified using a conventional separator or classifier. Examples of such a separator include a wet separator, such as a sedimentation tank, a hydrocyclone, and a centrifugal separator. Examples of such a classifier include a dry classifier, such as a cyclone and an air separator. The resultant mixed materials are filled into a crucible made of, for example, SiC, quartz, alumina, and BN, and calcined in an inert atmosphere, such as argon and nitrogen, a reductive atmosphere containing hydrogen, or an oxidative atmosphere in the atmosphere. The calcination is carried out at a predetermined temperature and for a predetermined duration. The calcined materials may be, for example, pulverized, dispersed, and filtrated to obtain a desired fluorescent material powder. Solid-liquid separation may be carried out using conventional methods, such as filtration, vacuum filtration, pressure-filtration, centrifugal separation, and decantation. Drying may be carried out using conventional apparatuses, such as a vacuum-dryer, a hot-air dryer, a conical dryer, and a rotary evaporator.

(Fluorescence Member)

The light emitting device may incorporate, for example, a fluorescent material and a resin, so as to have a fluorescence member that covers a light emitting element. Examples of the resin that forms a fluorescence member include a thermoplastic resin and a thermosetting resin. Specific examples of the thermosetting resin include an epoxy resin, a silicone resin, and a modified silicone resin, such as an epoxy-modified silicone resin.

The fluorescence member may contain other components as necessary in addition to a fluorescent material and a resin. Examples of the other components include a filler, such as silica, barium titanate, titanium oxide, and aluminum oxide; a light stabilizer; and a colorant. When the fluorescence member incorporates other components, the amount of the other components contained is not particularly limited, and may be appropriately selected according to the purpose, for example. For example, when a filler is incorporated as another component, the amount contained may be 0.01 parts by weight to 20 parts by weight relative to 100 parts by weight of the resin.

EXAMPLES

Hereinafter, the Examples of the present disclosure will be specifically described, but the present disclosure is by no means limited to these Examples.

(Fluorescent Material)

Before the production of the light emitting devices, red fluorescent materials and green fluorescent materials were prepared as fluorescent materials for Examples and Comparative Examples as shown in the Table below.

As a red fluorescent material, Fluorescent materials 1 to 4 and Fluorescent materials C1 to C3 were prepared. Fluorescent material 1 is represented by $3.0MgO.(0.1/2)Sc_2O_3.0.65MgF_2.0.25CaF_2.0.9GeO_2.(0.1/2)Ga_2O_3$:Mn. Fluorescent material 2 is represented by $2.75MgO.1.0MgF_2.0.25CaF_2.0.95GeO_2.0.05TiO_2$:Mn. Fluorescent material 3 is represented by $3.4MgO.(0.1/2)Sc_2O_3.0.5MgF_2.0.9GeO_2.(0.1/2)Ga_2O_3$:Mn. Fluorescent material 4 is a germanate fluorescent material represented by $3.1MgO.0.65MgF_2.0.25CaF_2.0.9GeO_2.(0.1/2)Ga_2O_3$:Mn. Fluorescent material C1 is an MGF fluorescent material represented by $3.5MgO.0.5MgF_2.GeO_2$:Mn. Fluorescent material C2 is a CASN fluorescent material represented by $CaAlSiN_3$:Eu. Fluorescent material C3 is a KSF fluorescent material represented by $K_2SiF_6$:Mn.

As a green fluorescent material, Fluorescent materials 5 to 10 were prepared. Fluorescent materials 5 to 7 are β sialon fluorescent materials represented by $Si_{6-z}Al_zO_zN_{8-z}$:Eu ($0<z\leq4.2$, variations due to difference in value z). Fluorescent material 8 is a chlorosilicate fluorescent material represented by $Ca_8MgSi_4O_{16}Cl_{2-\delta}$:Eu ($0\leq\delta\leq1$, δ indicates deviations in the composition of Cl). Fluorescent material 9 is a silicate fluorescent material represented by $(Ba,Sr)_2SiO_4$:Eu. Fluorescent material 10 is a thiogallate fluorescent material represented by $SrGa_2S_4$:Eu.

Figure 3:
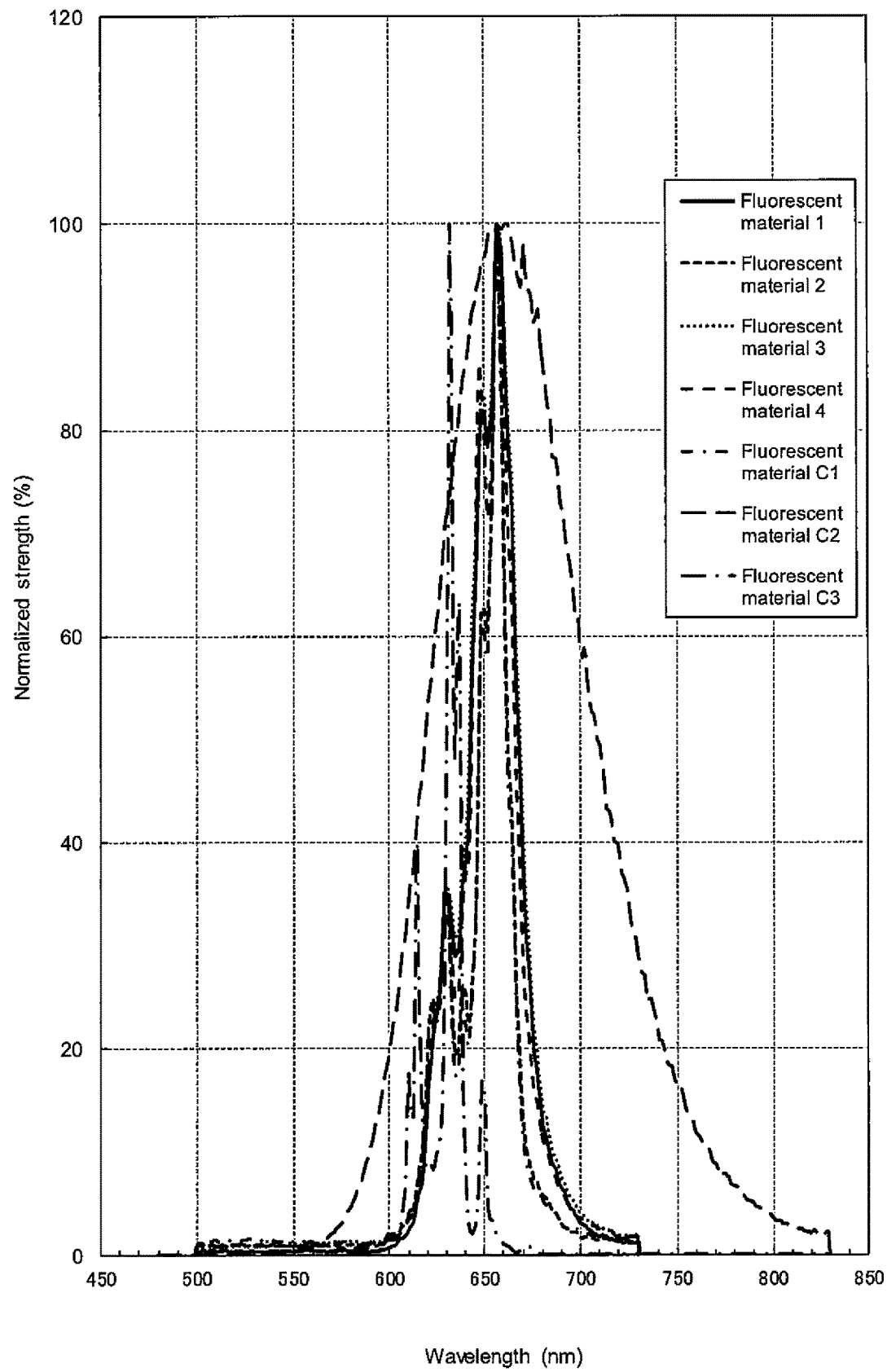
FIG. 3 shows light emission spectra of red fluorescent materials according to the present embodiment.
Figure 4:
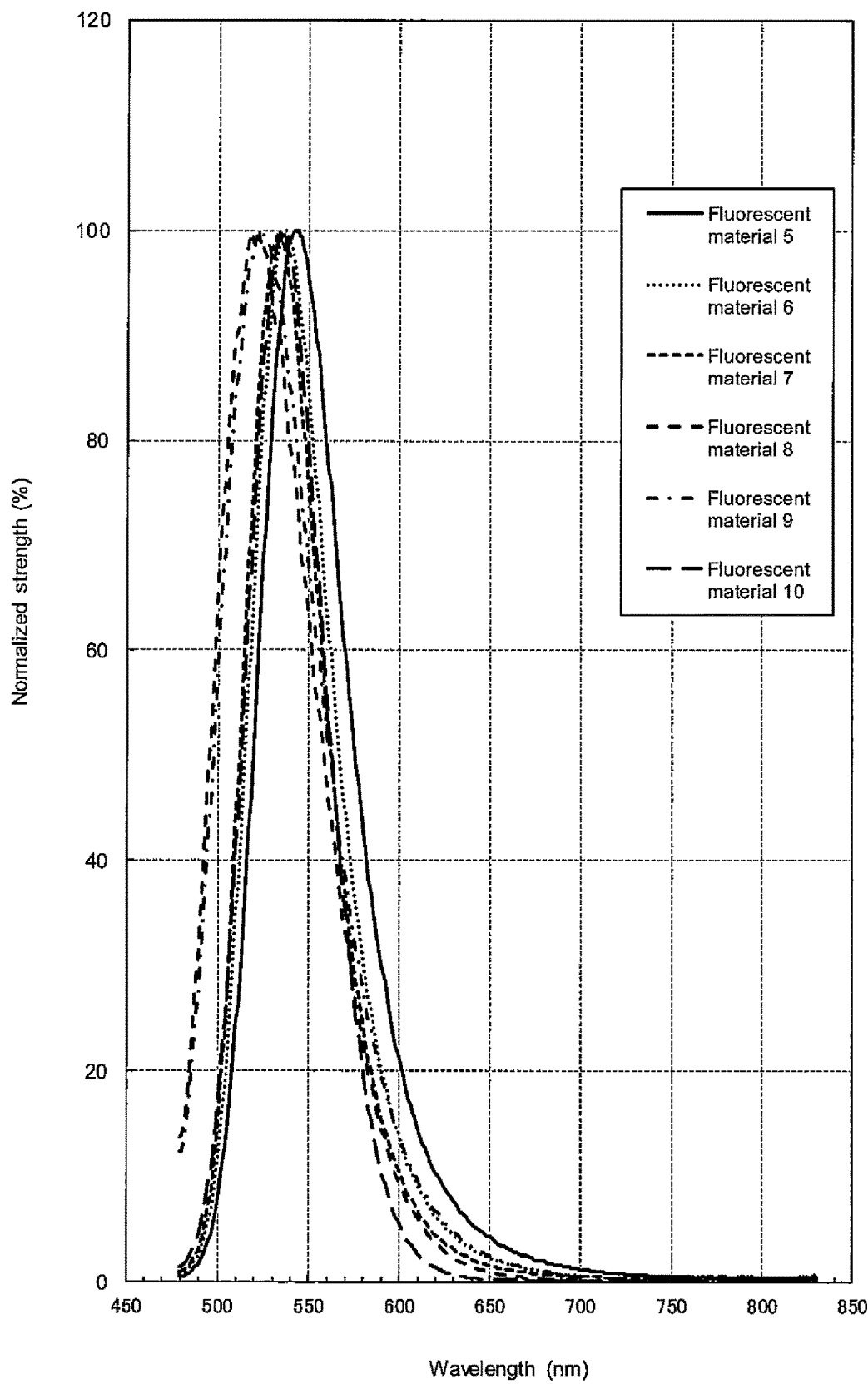
FIG. 4 shows light emission spectra of green fluorescent materials according to the present embodiment.

For each fluorescent material, the light emitting peak wavelength, the wavelength width at 50% strength (wavelength width that is 50% of the maximum light emission strength), and the average light emission strength, when the maximum light emission strength is taken as 100%, in the wavelength range of from 600 nm to 620 nm are shown in the following table. FIGS. 3 and 4 show light emission spectra indicating the light emission strengths relative to the wavelength when the maximum light emission strength of each of the fluorescences is taken as 100%.

Examples 1 to 4 and Comparative Examples 1 and 4

Preparation of Light Emitting Devices

Light emitting devices including an LED (light emitting element) that emits blue-light having a wavelength of 445 nm, one of the red fluorescent materials, and one of the green light fluorescent materials as indicated in Table 2 were prepared.

For each light emitting device, the red fluorescent material and the green light fluorescent material were added to a silicone resin (Shin-Etsu Chemical Co., Ltd.) such that the chromaticity coordinates of mixed light emitted by each light emitting device were around x=0.250, y=0.220, fol-

TABLE 1

| | Composition | Peak wavelength $\lambda p$ (nm) | Wavelength width at 50% strength (nm) | Average light emission strength in 600 nm-620 nm |
|---|---|---|---|---|
| Fluorescent material 1 | $3.0MgO \cdot (0.1/2) Sc_2O_3 \cdot 0.65MgF_2 \cdot 0.25CaF_2 \cdot 0.9GeO_2 \cdot (0.1/2)Ga_2O_3$:Mn | 658 | 25 | 3.9% |
| Fluorescent material 2 | $2.75MgO \cdot 1.0MgF_2 \cdot 0.25CaF_2 \cdot 0.95GeO_2 \cdot 0.05TiO_2$:Mn | 658 | 16 | 5.5% |
| Fluorescent material 3 | $3.4MgO \cdot (0.1/2) Sc_2O_3 \cdot 0.5MgF_2 \cdot 0.9GeO_2 \cdot (0.1/2) Ga_2O_3$:Mn | 659 | 26 | 4.9% |
| Fluorescent material 4 | $3.1MgO \cdot 0.65MgF_2 \cdot 0.25CaF_2 \cdot 0.9GeO_2 \cdot (0.1/2) Ga_2O_3$:Mn | 658 | 23 | 4.8% |
| Fluorescent material C1 | $3.5MgO \cdot 0.5MgF_2 \cdot GeO_2$:Mn | 658 | 15 | 5.6% |
| Fluorescent material C2 | $CaAlSiN_3$:Eu | 661 | 90 | 34.6% |
| Fluorescent material C3 | $K_2SiF_6$:Mn | 632 | 8 | 11.9% |
| Fluorescent material 5 | $Si_{6-z}Al_zO_zN_{8-z}$:Eu | 544 | 56 | 15.0% |
| Fluorescent material 6 | $Si_{6-z}Al_zO_zN_{8-z}$:Eu | 537 | 52 | 9.5% |
| Fluorescent material 7 | $Si_{6-z}Al_zO_zN_{8-z}$:Eu | 533 | 50 | 7.0% |
| Fluorescent material 8 | $Ca_8MgSi_4O_{16}Cl_2$:Eu | 523 | 63 | 6.2% |
| Fluorescent material 9 | $(Ba, Sr)_2SiO_4$:Eu | 523 | 65 | 9.9% |
| Fluorescent material 10 | $SrGa_2S_4$:Eu | 535 | 50 | 3.0% |

Fluorescent materials 1 to 4, which are red fluorescent materials, had a peak fluorescence wavelength in the range of from 658 nm to 659 nm, a wavelength width at 50% strength of 45 nm or less, and an average light emission strength in the range of from 600 nm to 620 nm of 20% or less.

Although the light emitting peak wavelength of Fluorescent material C2 was 661 nm, the wavelength width at 50% strength was as wide as 90 nm, and the average light emission strength in the range of 600 nm to 620 nm was 20% or more, and the light contained many yellow-red components. Fluorescent material C3 had a peak fluorescence wavelength of 632 nm, which is shortwave, a wavelength width at 50% strength of 8 nm, which is very narrow, and an average light emission strength of 20% or less.

Fluorescent materials 5 to 10, which are green fluorescent materials, had peak fluorescence wavelength in the range of from 523 nm to 544 nm, a wavelength width at 50% strength of as narrow as 70 nm or less, and an average light emission strength in the range of from 600 nm to 620 nm of 20% or less.

lowed by mixing/dispersing and defoaming to yield a fluorescent material-containing resin composition. Next, the resultant fluorescent material-containing resin composition was poured onto a light emitting element to fill the recess, followed by heating at 150° C. for 4 hours to cure the resin composition. Each light emitting device was prepared through these steps.

For the resultant light emitting devices, the initial properties and the NTSC ratio of the light emission were measured.

The NTSC ratio for each light emitting device was measured as follows: A conventional color filter through which light from a light emitting device based on YAG:Ce exhibits an NTSC ratio of around 70% was used as a color filter. The light from each light emitting device was passed through the color filter, and blue, green, and red light were extracted. The NTSC ratio indicating the color reproducing range at that time was obtained from each color light, and the resultant NTSC ratios were evaluated each as a relative color reproducing range, taking the NTSC ratio obtained by the light emitting device of Example 1 as 100.0%.

Figure 5:
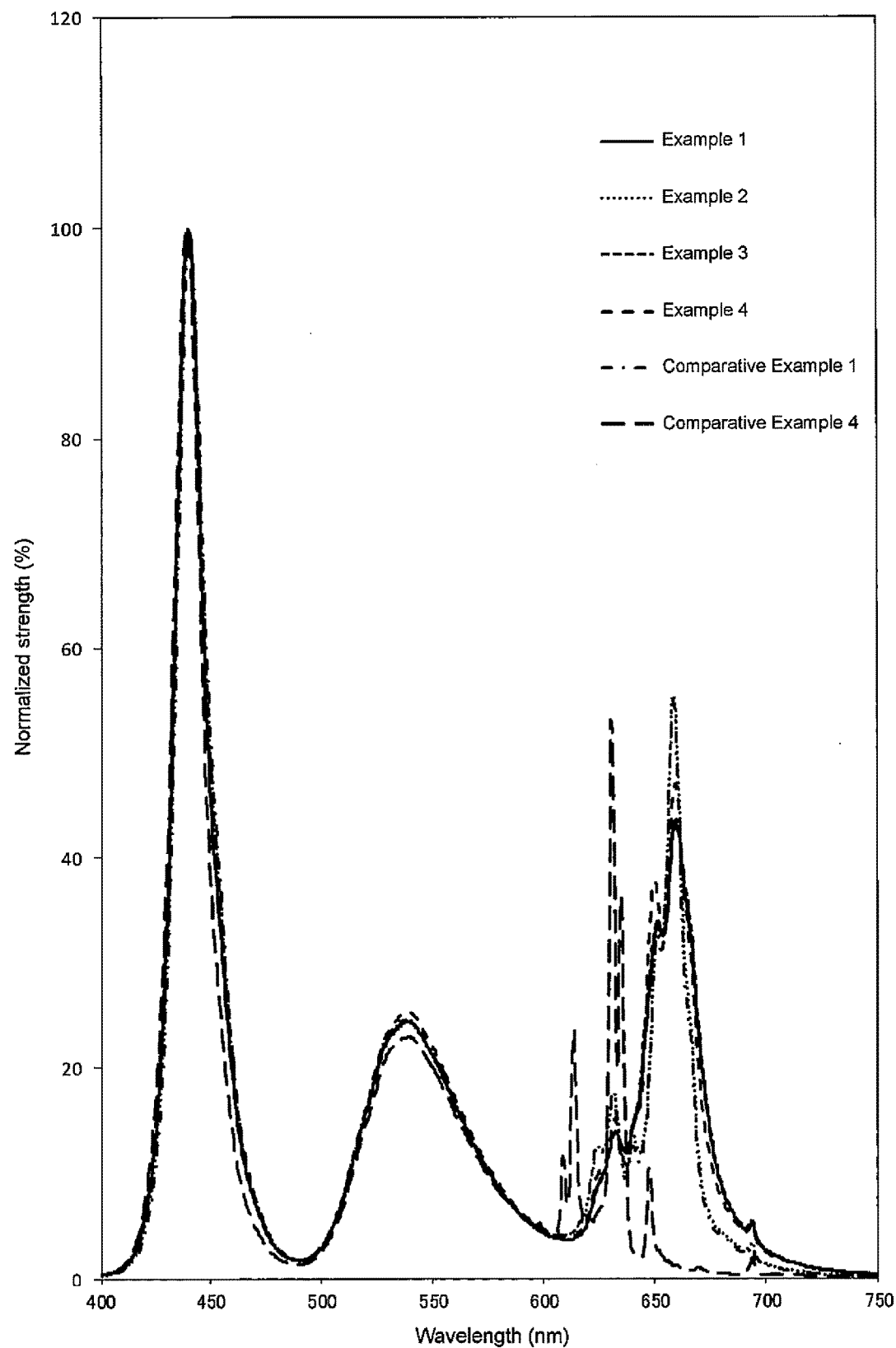
FIG. 5 shows the light emission spectra of the light emitting devices of Examples 1 to 4 and of Comparative Examples 1 and 4, normalized to the maximum light emission strength in the range of from 400 nm to 455 nm.
Figure 6:
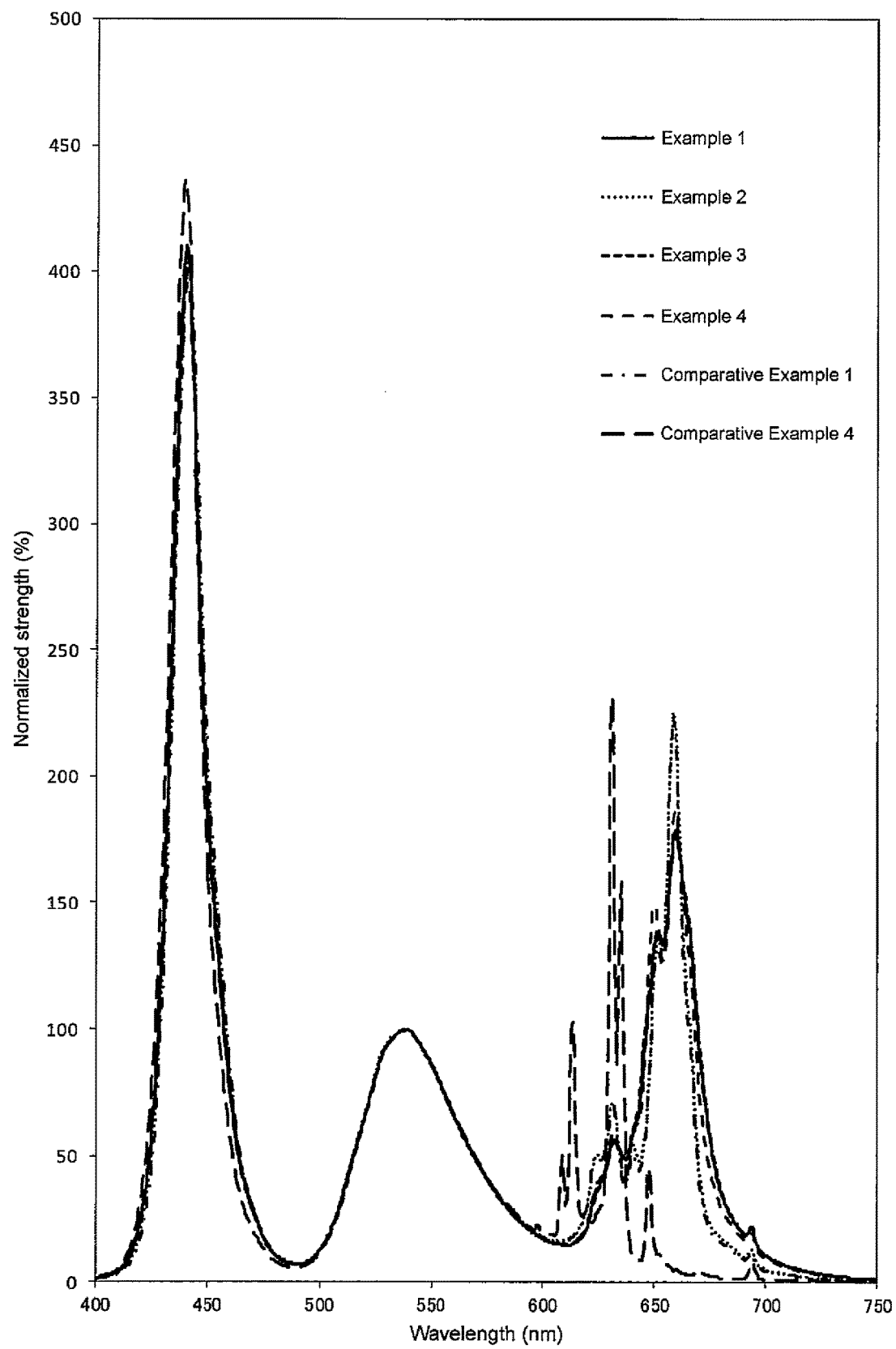
FIG. 6 shows the light emission spectra of the light emitting devices of Examples 1 to 4 and of Comparative Examples 1 and 4, normalized to the maximum light emission strength in the range of from 520 nm to 550 nm.

FIGS. 5 and 6 show the light emission spectra of the light emitting devices of Examples 1 to 4 and of Comparative Examples 1 and 4. FIG. 5 shows graphs of the light emission spectra indicating the light emission strengths relative to the wavelength, normalized to the maximum light emission strength in the range of from 400 nm to 455 nm. FIG. 6 shows graphs of the light emission spectra normalized to the maximum light emission strength in the range of from 520 nm to 550 nm.

620 nm of 8.5% when the maximum light emission strength in the range of from 400 nm to 455 nm is taken as a standard, and an average light emission strength in the range of as high as 36.8% when the maximum light emission strength in the range of 520 nm to 550 nm is taken as a standard. Thus, Comparative Example 4 is somewhat inferior to the Examples in terms of color reproducing range.

TABLE 2

| | Peak light emission wavelength of Light emitting element (nm) | Fluorescent materials | | Initial properties | | | Relative color reproducing range xy | Average light emission strength in 600 nm-620 nm | |
|---|---|---|---|---|---|---|---|---|---|
| | | Red fluorescent material | Green fluorescent material | x | y | Luminous flux ratio | | 400 nm-455 nm as a standard | 520 nm-550 nm as a standard |
| Example 1 | 445 | Fluorescent material 1 | Fluorescent material 5 | 0.250 | 0.220 | 100 | 100.0% | 4.0% | 16.4% |
| Example 2 | | Fluorescent material 2 | | 0.250 | 0.220 | 97.7 | 99.8% | 4.6% | 18.7% |
| Example 3 | | Fluorescent material 3 | | 0.250 | 0.220 | 100.1 | 100.1% | 4.0% | 16.2% |
| Example 4 | | Fluorescent material 4 | | 0.250 | 0.220 | 94.7 | 99.7% | 4.3% | 16.9% |
| Comparative Example 1 | | Fluorescent material C1 | | 0.250 | 0.220 | 85.7 | 99.3% | 4.7% | 19.1% |
| Comparative Example 4 | | Fluorescent material C2 | | 0.250 | 0.220 | 138.4 | 98.3% | 8.5% | 36.8% |

Comparative Example 1 incorporates Fluorescent material C1, which is a conventional MGF fluorescent material. Although Comparative Example 1 has a relative color reproducing range equivalent to that of Example 1, it has a lower luminous flux. Here, Examples 1 to 4 and Comparative Example 1 had an average light emission strength of 6% or less in the range of 600 nm to 620 nm when the maximum light emission strength in the range of from 400 nm to 455 nm was taken as a standard, and an average light emission strength in the range of 30% or less when the maximum light emission strength in the range of 520 nm to 550 nm was taken as a standard. The results show that the germanate fluorescent material in which various elements were substituted has a high luminous flux.

Comparative Example 4 incorporates Fluorescent material C3, which is a fluoride fluorescent material. Although Comparative Example 4 has a high luminous flux, it has an average light emission strength in the range of 600 nm to Examples 5 and 6 and Comparative Examples 2 and 3

Light emitting devices were prepared in the same manner as Example 1, except that the light emitting wavelength and the red fluorescent material of the light emitting element in Example 1 were changed as shown in Table 3. The devices were evaluated in the same manner.

Figure 7:
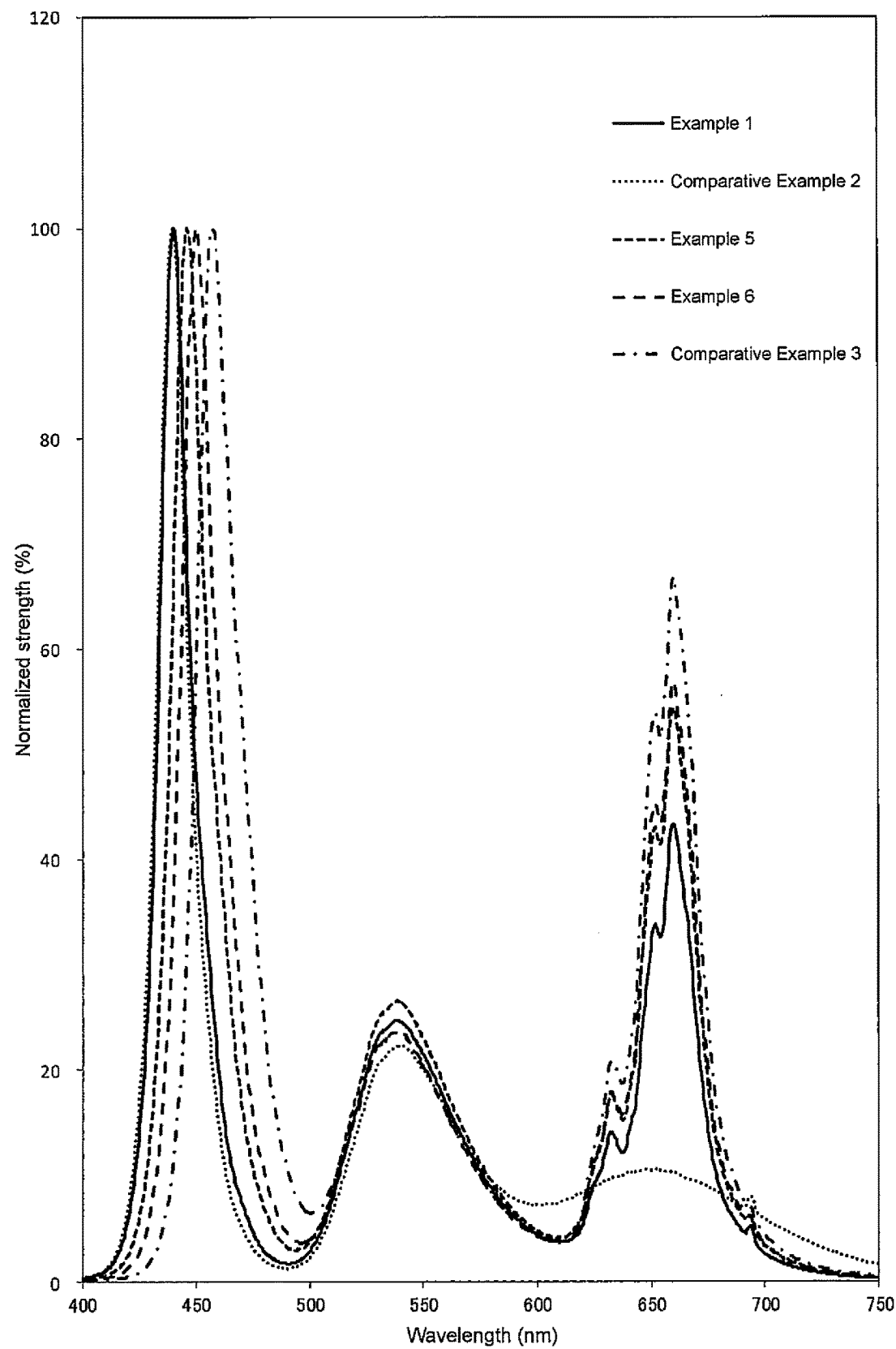
FIG. 7 shows the light emission spectra of the light emitting devices of Examples of 1, 5, and 6 and of Comparative Examples 2 and 3, normalized to the maximum light emission strength in the range of from 400 nm to 455 nm.
Figure 8:
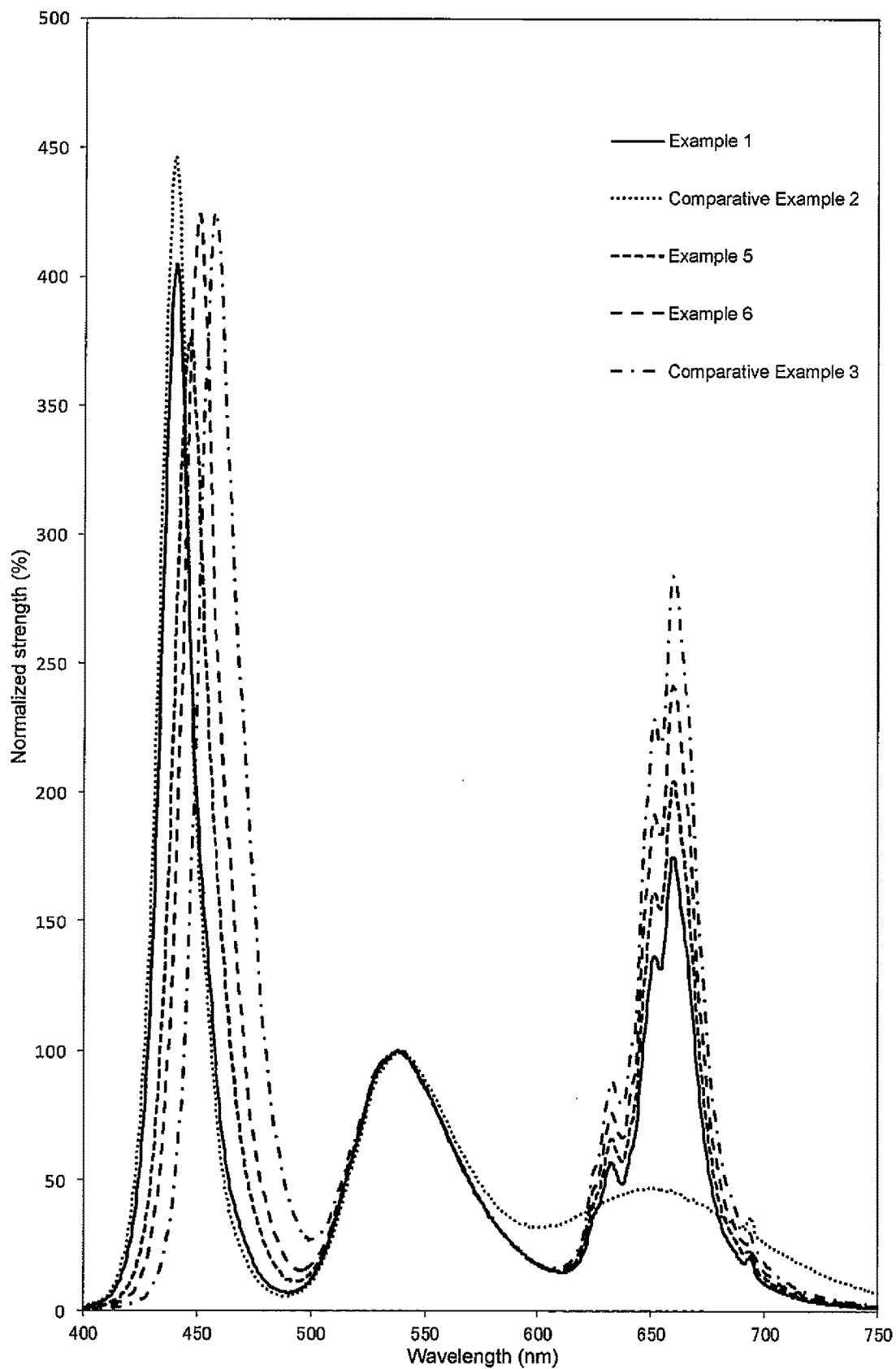
FIG. 8 shows the light emission spectra of the light emitting devices of Examples 1, 5, and 6 and of Comparative Examples 2 and 3, normalized to the maximum light emission strength in the range of from 520 nm to 550 nm.

FIGS. 7 and 8 show the light emission spectra of the light emitting devices of Examples 5 and 6 and Comparative Examples 2 and 3. FIG. 7 shows graphs of the light emission spectra indicating the light emission strengths relative to the wavelength, normalized to the maximum light emission strength in the range of from 400 nm to 455 nm. FIG. 8 shows graphs of the light emission spectra normalized to the maximum light emission strength in the range of from 520 nm to 550 nm.

TABLE 3

| | Peak light emission wavelength of Light emitting element (nm) | Fluorescent materials | | Initial properties | | | Relative color reproducing range xy | Average light emission strength in 600 nm-620 nm | |
|---|---|---|---|---|---|---|---|---|---|
| | | Red fluorescent material | Green fluorescent material | x | y | Luminous flux ratio | | 400 nm-455 nm as a standard | 520 nm-550 nm as a standard |
| Example 1 | 445 | Fluorescent material 1 | Fluorescent material 5 | 0.250 | 0.220 | 100 | 100.0% | 4.0% | 16.4% |
| Comparative Example 2 | | Fluorescent material C2 | | 0.250 | 0.219 | 117.4 | 92.1% | 7.6% | 33.8% |
| Example 5 | 450 | Fluorescent material 1 | | 0.250 | 0.220 | 94.6 | 100.2% | 4.5% | 17.1% |
| Example 6 | 455 | | | 0.247 | 0.213 | 88.3 | 100.0% | 4.1% | 17.6% |
| Comparative Example 3 | 460 | | | 0.248 | 0.223 | 76.3 | 86.2% | 4.4% | 18.5% |

Although Comparative Example 2 has a high luminous flux, it has a low NSTC ratio, and an average light emission strength in the range of 600 nm to 620 nm of 7.6% when the maximum light emission strength in the range of from 400 nm to 455 nm is taken as a standard, and an average light emission strength in the range of as high as 33.8% when the maximum light emission strength in the range of 520 nm to 550 nm is taken as a standard. These yellow-red components are believed to degrade the color purity of both red and green, resulting in a poor NTSC ratio.

Examples 5 and 6 and Comparative Example 3 demonstrate the influence of the light emitting wavelength on the blue light-emitting LED, indicating that the shorter the light emitting wavelength, the higher the luminous flux. When the light emitting wavelength is 460 nm, the luminous flux is significantly lower and the NTSC ratio is also lower, so that the light emitting wavelength is preferably 455 nm or less. This is because a red fluorescent material is less likely to be excited by longer wavelength light. The average light emission strength between 600 nm to 620 nm is 6% or less when the maximum light emission strength in the range of from 400 nm to 455 nm is taken as a standard, and is as low as 30% or less when the maximum light emission strength in the range of 520 nm to 550 nm is taken as a standard.

Examples 7 to 11

Light emitting devices were prepared in the same manner as Example 1, except that the green fluorescent material of the light emitting element in Example 1 was changed as shown in Table 4. The devices were evaluated in the same manner.

Figure 9:
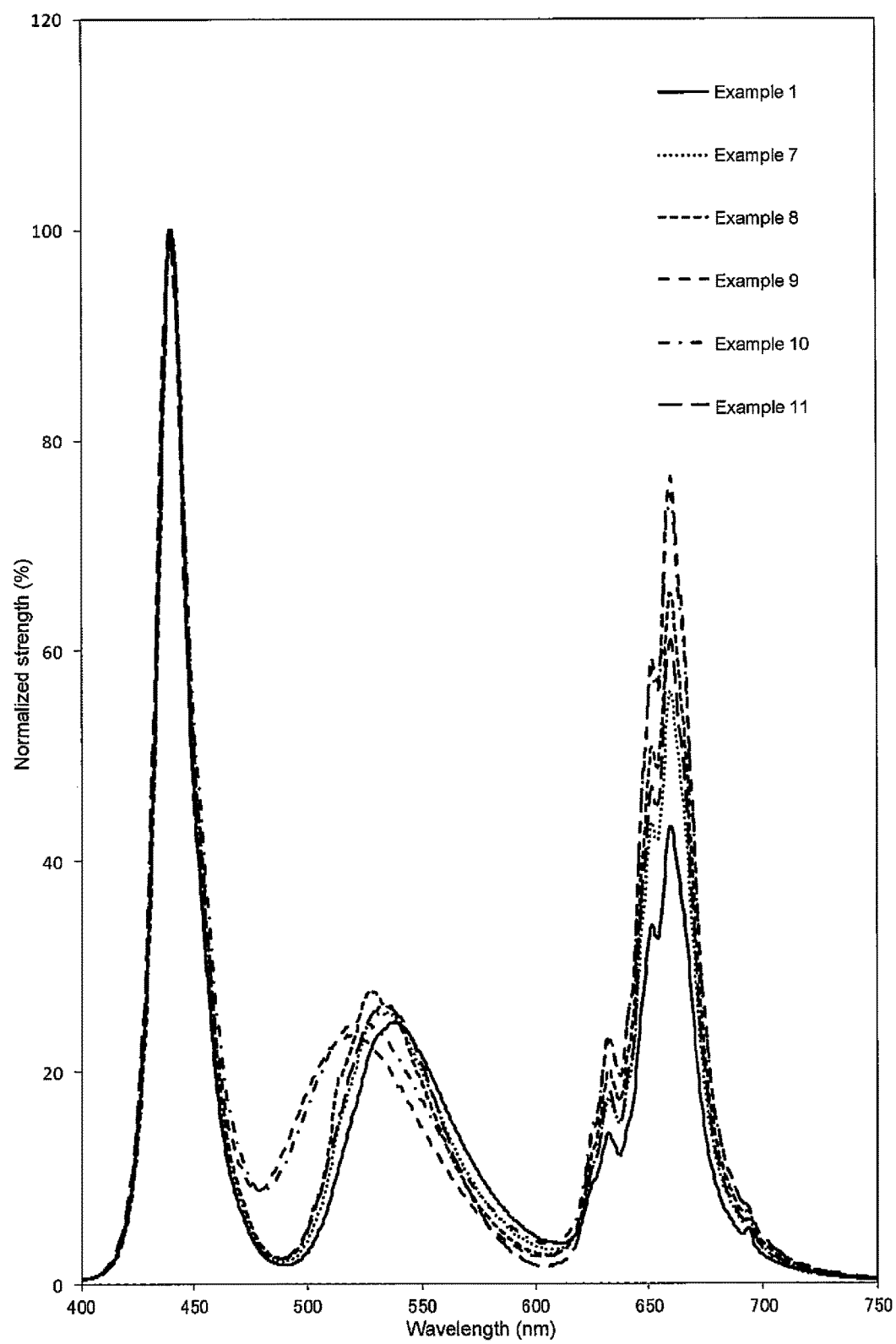
FIG. 9 shows the light emission spectra of the light emitting devices of Examples 1 and 7 to 11, normalized to the maximum light emission strength in the range of from 400 nm to 455 nm.
Figure 10:
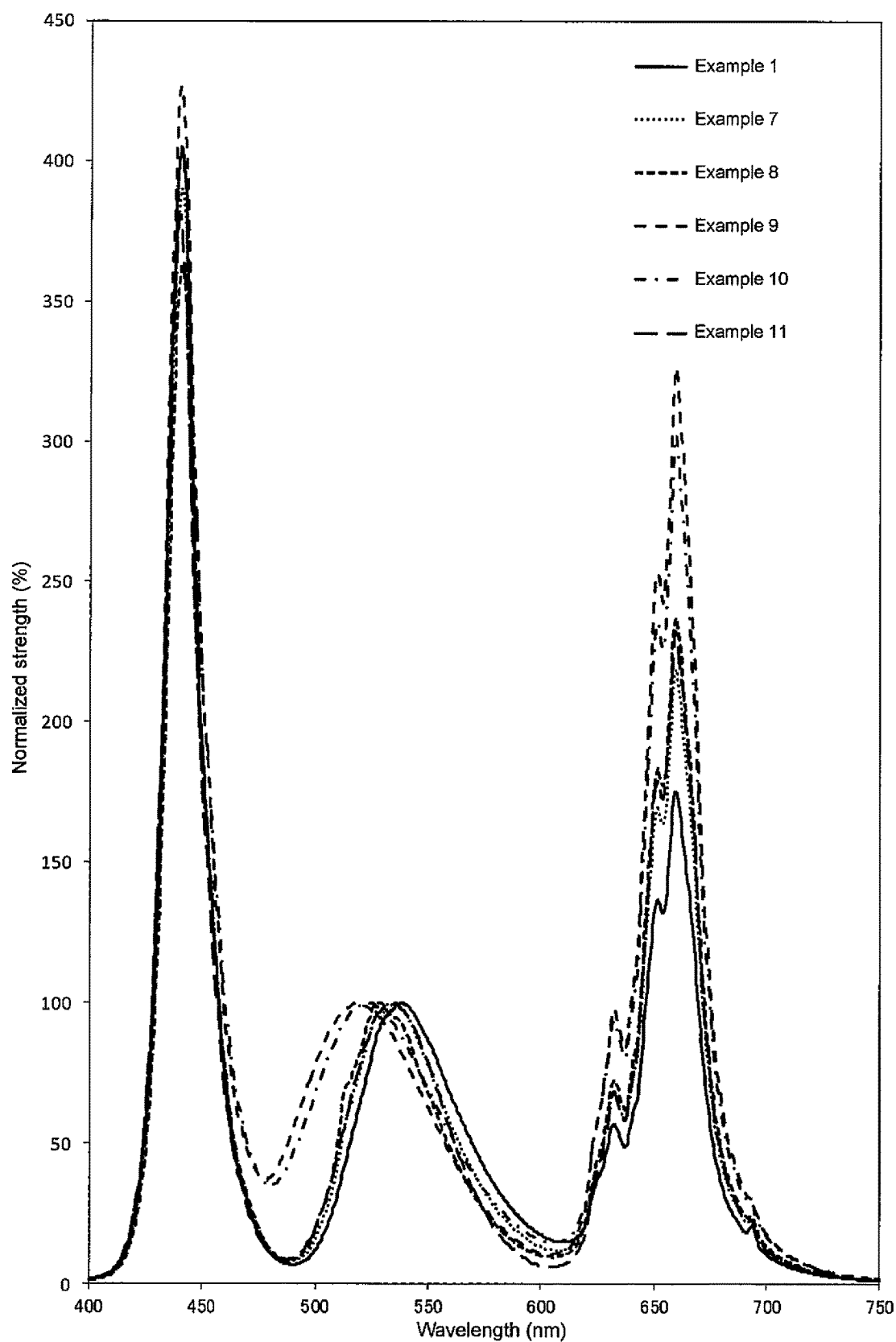
FIG. 10 shows the light emission spectra of the light emitting devices of Examples 1 and 7 to 11, normalized to the maximum light emission strength in the range of from 520 nm to 550 nm.

FIGS. 9 and 10 show the light emission spectra of the light emitting devices of Example 7 to 11. FIG. 9 shows graphs of the light emission spectra indicating the light emission strengths relative to the wavelength, normalized to the maximum light emission strength in the range of from 400 nm to 455 nm. FIG. 10 shows graphs of the light emission spectra normalized to the maximum light emission strength in the range of from 520 nm to 550 nm.

The light emitting devices of Examples 7 to 11 have an average light emission strength of 6% or less in the range of from 600 mu to 620 nm when the maximum light emission strength in the range of from 400 nm to 455 nm is taken as a standard, and an average light emission strength of as low as 30% or less when the maximum light emission strength of 520 nm to 550 nm is taken as a standard. This indicates that by changing the green fluorescent material, the color reproducing range can be further expanded.

The light emitting devices of the embodiment according to the present invention, which include a blue light-emitting diode as a light source, exhibit superior light emitting properties, and can be suitably used for white LED displays, a backlight light source, a light source for lighting and so forth. It may also be used as a light emitting device for backlight for monitors and smartphones, for example, which are desired to reproduce deep and bright RGB colors.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:
1. A light emitting device comprising:
 a light emitting element having a peak light emission wavelength of from 400 nm to 455 nm;
 a first fluorescent material that is represented by formula (I) and has a peak fluorescence wavelength in a range of from 650 nm to 670 nm; and
 a second fluorescent material that has a peak fluorescence wavelength in a range of from 520 nm to 550 nm,

TABLE 4

| | Peak light emission wavelength of Light emitting element (nm) | Fluorescent materials | | Initial properties | | | Relative color reproducing range xy | Average light emission strength in 600 nm-620 nm | |
|---|---|---|---|---|---|---|---|---|---|
| | | Red fluorescent material | Green fluorescent material | x | y | Luminous flux ratio | | 400 nm-455 nm as a standard | 520 nm-550 nm as a standard |
| Example 1 | 445 | Fluorescent material 1 | Fluorescent material 5 | 0.250 | 0.220 | 100.0 | 100.0% | 4.0% | 16.4% |
| Example 7 | | | Fluorescent material 6 | 0.250 | 0.220 | 84.9 | 105.8% | 3.6% | 14.1% |
| Example 8 | | | Fluorescent material 7 | 0.250 | 0.220 | 74.9 | 109.6% | 3.3% | 12.0% |
| Example 9 | | | Fluorescent material 8 | 0.246 | 0.207 | 76.4 | 106.6% | 3.2% | 13.8% |
| Example 10 | | | Fluorescent material 9 | 0.251 | 0.218 | 84.6 | 104.4% | 4.4% | 17.6% |
| Example 11 | | | Fluorescent material 10 | 0.244 | 0.218 | 82.7 | 109.7% | 2.2% | 8.5% | wherein the light emitting device exhibits a light emission spectrum with an average light emission strength of 6% or less in a range of from 600 nm to 620 nm, when the maximum light emission strength in a range of from 400 nm to 455 nm is taken as 100%;

$$(x-a)\,MgO \cdot a(M^a)O \cdot b/2(M^b)_2O_3 \cdot yMgF_2 \cdot c(M^c)X_2 \cdot (1-d-e)GeO_2 \cdot d(M^d)O_2 \cdot e/2(M^e)_2O_3 {:} M \quad (I)$$

wherein $M^a$ is at least one element selected from the group consisting of Ca, Sr, Ba, and Zn; $M^b$ is at least one element selected from the group consisting of Sc, La, and Lu; $M^c$ is at least one element selected from the group consisting of Ca, Sr, Ba, and Zn; X is at least one element selected from the group consisting of F and Cl; $M^d$ is at least one element selected from the group consisting of Ti, Sn, and Zr; $M^e$ is at least one element selected from the group consisting of B, Al, Ga, and In; and x, y, a, b, c, d, and e satisfy 2≤x≤4, 0<y≤2, 0≤a≤1.5, 0≤b<1, 0≤c≤2, 0≤d≤0.5, 0≤e<1, and 0<d+e<1, respectively.

2. A light emitting device comprising:
a light emitting element having a peak light emission wavelength of from 400 nm to 455 nm;
a first fluorescent material that is represented by formula (I) and has a peak fluorescence wavelength in a range of 650 nm to 670 nm; and
a second fluorescent material that has a peak fluorescence wavelength in a range of from 520 nm to 550 nm,
wherein the light emitting device exhibits a light emission spectrum with an average light emission strength of 30% or less in a range of from 600 nm to 620 nm, when the maximum light emission strength in a range of from 520 nm to 550 nm is taken as 100%;

$$(x-a)\,MgO \cdot a(M^a)O \cdot b/2(M^b)_2O_3 \cdot yMgF_2 \cdot c(M^c)X_2 \cdot (1-d-e)GeO_2 \cdot d(M^d)O_2 \cdot e/2(M^e)_2O_3 {:} M \quad (I)$$

wherein $M^a$ is at least one element selected from the group consisting of Ca, Sr, Ba, and Zn; $M^b$ is at least one element selected from the group consisting of Sc, La and Lu; $M^c$ is at least one element selected from the group consisting of Ca, Sr, Ba, and Zn; X is at least one element selected from the group consisting of F and Cl; $M^d$ is at least one element selected from the group consisting of Ti, Sn and Zr; $M^e$ is at least one element selected from the group consisting of B, Al, Ga and In; and x, y, a, b, c, d, and e satisfy 2≤x≤4, 0<y≤2, 0≤a≤1.5, 0≤b<1, 0≤c≤2, 0≤d≤0.5, 0≤e<1, and 0<d+e<1, respectively.

3. The light emitting device according to claim 1, wherein the second fluorescent material is at least one selected from a β sialon fluorescent material represented by formula (IIa); a silicate fluorescent material represented by formula (IIb); a halo silicate fluorescent material represented by formula (IIc); and a sulfide fluorescent material represented by formula (IId);

$$Si_{6-z}Al_zO_zN_{8-z}{:}Eu \quad (IIa)$$

wherein, z satisfies 0<z≤4.2

$$(Ba,Sr,Ca,Mg)_2SiO_4{:}Eu \quad (IIb)$$

$$(Ca,Sr,Ba)_8MgSi_4O_{16}(F,Cl,Br)_2{:}Eu \quad (IIc)$$

$$(Ba,Sr,Ca)Ga_2S_4{:}Eu \quad (IId).$$

4. The light emitting device according to claim 1, wherein the second fluorescent material has a half bandwidth of a light emission spectrum of 70 nm or less.

5. The light emitting device according to claim 1, wherein the light emitting element comprises a first light emitting element having a peak light emission wavelength of from 400 nm to 430 nm, and a second light emitting element having a peak light emission wavelength of from 430 nm to 455 nm.

6. The light emitting device according to claim 1, wherein a=0; $M^b$ is Sc; $M^c$ is Ca; X is F or Cl; $M^d$ is Ti; and $M^e$ is Ga in formula (I).

7. The light emitting device of claim 6, wherein y, b, c, d, and e in formula (I) satisfy 0<y≤1.5, 0≤b<0.5, 0≤c≤1.5, 0≤d≤0.25, and 0≤e≤0.5, respectively.

8. The light emitting device according to claim 2, wherein the second fluorescent material is at least one selected from a β sialon fluorescent material represented by formula (IIa); a silicate fluorescent material represented by formula (IIb); a halo silicate fluorescent material represented by formula (IIc); and a sulfide fluorescent material represented by formula (IId);

$$Si_{6-z}Al_zO_zN_{8-z}{:}Eu \quad (IIa)$$

wherein, z satisfies 0<z≤4.2

$$(Ba,Sr,Ca,Mg)_2SiO_4{:}Eu \quad (IIb)$$

$$(Ca,Sr,Ba)_8MgSi_4O_{16}(F,Cl,Br)_2{:}Eu \quad (IIc)$$

$$(Ba,Sr,Ca)Ga_2S_4{:}Eu \quad (IId).$$

9. The light emitting device according to claim 2, wherein the second fluorescent material has a half bandwidth of a light emission spectrum of 70 nm or less.

10. The light emitting device according to claim 2, having an average light emission strength of 20% or less in the range of from 600 nm to 620 nm when the maximum light emission strength of the second fluorescent material is taken as 100%.

11. The light emitting device according to claim 2, wherein the light emitting element comprises a first light emitting element having a peak light emission wavelength of from 400 nm to 430 nm, and a second light emitting element having a peak light emission wavelength of from 430 nm to 455 nm.

12. The light emitting device according to claim 2, wherein a=0; $M^b$ is Sc; $M^c$ is Ca; X is F or Cl; $M^d$ is Ti; and $M^e$ is Ga in formula (I).

13. The light emitting device of claim 12, wherein y, b, c, d, and e in formula (I) satisfy 0<y≤1.5, 0≤b<0.5, 0≤c≤1.5, 0≤d≤0.25, and 0≤e≤0.5, respectively.

14. The light emitting device of claim 1, wherein $M^b$ contains Sc.

15. The light emitting device of claim 1, wherein $M^c$ contains Ca and X is F or Cl.

16. The light emitting device of claim 1, wherein $M^d$ contains Ti.

17. The light emitting device of claim 1, wherein $M^e$ contains Ga.

* * * * *